US012648077B2

(12) United States Patent　　(10) Patent No.: US 12,648,077 B2

Proschwitz et al.　　(45) Date of Patent: Jun. 2, 2026

---

(54) INTEGRATED CIRCUIT PACKAGES HAVING REDUCED Z-HEIGHT

(71) Applicant: Intel Corporation, Santa Clara, CA (US)

(72) Inventors: Jan Proschwitz, Riesa SN (DE); Sonja Koller, Bavaria (DE); Thomas Wagner, Regelsbach (DE); Vishnu Prasad, Munich (DE); Wolfgang Molzer, Ottobrunn (DE)

(73) Assignee: Intel Corporation, Santa Clara, CA (US)

( * ) Notice: Subject to any disclaimer, the term of this patent is extended or adjusted under 35 U.S.C. 154(b) by 258 days.

(21) Appl. No.: 17/699,211

(22) Filed: Mar. 21, 2022

(65) Prior Publication Data

US 2023/0300975 A1　　Sep. 21, 2023

(51) Int. Cl.
H01L 21/48　　(2006.01)
H01K 3/30　　(2006.01)
(Continued)

(52) U.S. Cl.
CPC ........... *H05K 1/0284* (2013.01); *H05K 1/181* (2013.01); *H05K 3/305* (2013.01); *H10W 70/68* (2026.01);
(Continued)

(58) Field of Classification Search
CPC ................. H01L 21/4803; H01L 21/48; H01L 2224/16227; H01L 2224/17181; H01L 2224/81; H01L 2224/81192; H01L 2224/81815; H01L 2225/06517; H01L 2225/0652; H01L 2225/06572; H01L 23/053; H01L 23/13; H01L 23/49816; H01L 23/5385; H01L 23/00; H01L 23/498; H01L 24/16; H01L 24/17; H01L 25/0652; H01L 25/0657; H01L 25/18; H01L 25/065; H01L 2924/15153; H01L 2924/15159; H05K 1/0284; H05K 1/181; H05K 1/183;
(Continued)

(56) References Cited

U.S. PATENT DOCUMENTS 5,831,810 A　　11/1998　Bird et al.
2004/0118594 A1　6/2004　Dory et al.
(Continued)

FOREIGN PATENT DOCUMENTS

CN　　211531440 U　*　9/2020　............... H05K 3/00

OTHER PUBLICATIONS

Selected Application Underfills_Epotek_pp. 1-2_2017.*
Waffle Pack Chip Carrier Handling_Skyworks_p. 1-3_Feb. 2005.*

*Primary Examiner* — Timothy J Thompson
*Assistant Examiner* — Guillermo J Egoavil
(74) *Attorney, Agent, or Firm* — Akona IP PC

(57) ABSTRACT

Disclosed herein are microelectronic assemblies, as well as related apparatuses and methods. For example, in some embodiments, a microelectronic assembly may include a substrate having a surface including a first cavity; a first die at least partially nested in the first cavity and electrically coupled to the substrate; and a circuit board having a surface including a second cavity, wherein the surface of the substrate is electrically coupled to the surface of the circuit board, and wherein the first die extends at least partially into the second cavity in the circuit board.

14 Claims, 11 Drawing Sheets

(51) Int. Cl.

| | |
|---|---|
| *H01L 23/00* | (2006.01) |
| *H01L 23/13* | (2006.01) |
| *H01L 23/498* | (2006.01) |
| *H01L 25/065* | (2023.01) |
| *H01L 25/18* | (2023.01) |
| *H05K 1/02* | (2006.01) |
| *H05K 1/18* | (2026.01) |
| *H05K 1/181* | (2026.01) |
| *H05K 3/303* | (2026.01) |
| *H10W 70/68* | (2026.01) |
| *H10W 90/00* | (2026.01) |
| *H10W 99/00* | (2026.01) |
| *H10W 72/00* | (2026.01) |
| *H10W 72/20* | (2026.01) |
| *H10W 90/22* | (2026.01) |

(52) U.S. Cl.
CPC .......... *H10W 90/00* (2026.01); *H10W 99/00* (2026.01); *H05K 2201/09072* (2013.01); *H05K 2201/10378* (2013.01); *H05K 2201/1053* (2013.01); *H05K 2201/10734* (2013.01); *H10W 70/682* (2026.01); *H10W 72/072* (2026.01); *H10W 72/07236* (2026.01); *H10W 72/07254* (2026.01); *H10W 72/241* (2026.01); *H10W 72/247* (2026.01); *H10W 90/22* (2026.01); *H10W 90/701* (2026.01); *H10W 90/721* (2026.01); *H10W 90/724* (2026.01)

(58) Field of Classification Search
CPC .. H05K 1/02; H05K 1/18; H05K 2201/09072; H05K 2201/10378; H05K 2201/1053; H05K 2201/10734; H05K 3/305; H05K 3/30
USPC .......................................... 257/773; 361/764
See application file for complete search history.

(56)                    References Cited

U.S. PATENT DOCUMENTS

| | | | | |
|---|---|---|---|---|
| 2007/0284589 | A1* | 12/2007 | Ng | F21K 9/00 257/E33.059 |
| 2008/0029904 | A1* | 2/2008 | Yong | H01L 21/67333 257/778 |
| 2011/0204512 | A1* | 8/2011 | Camacho | H01L 21/6835 257/737 |
| 2013/0341075 | A1 | 12/2013 | Becker et al. | |
| 2021/0188516 | A1* | 6/2021 | Rochford | B32B 27/18 |

* cited by examiner

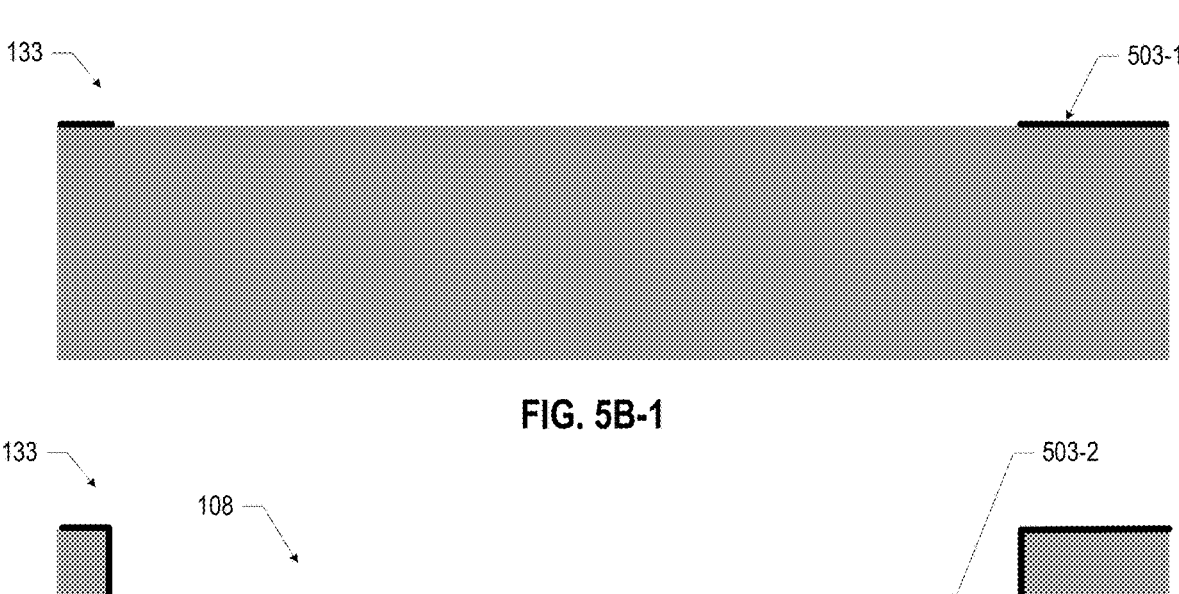
FIG. 5B-1
FIG. 5B-2
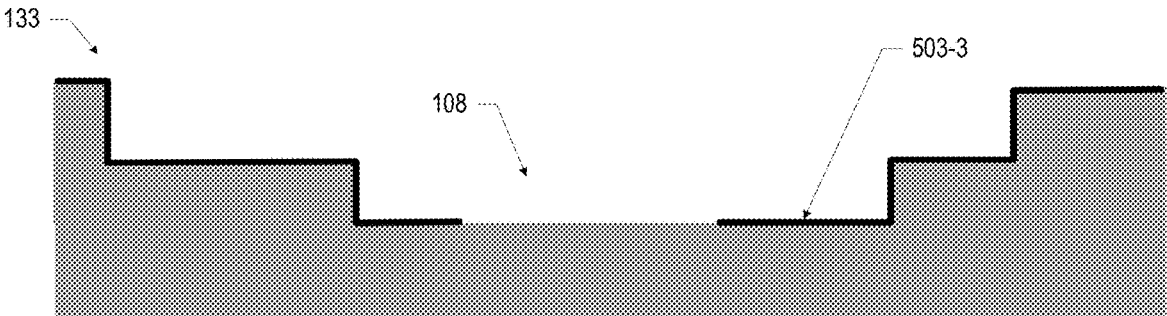
FIG. 5B-3
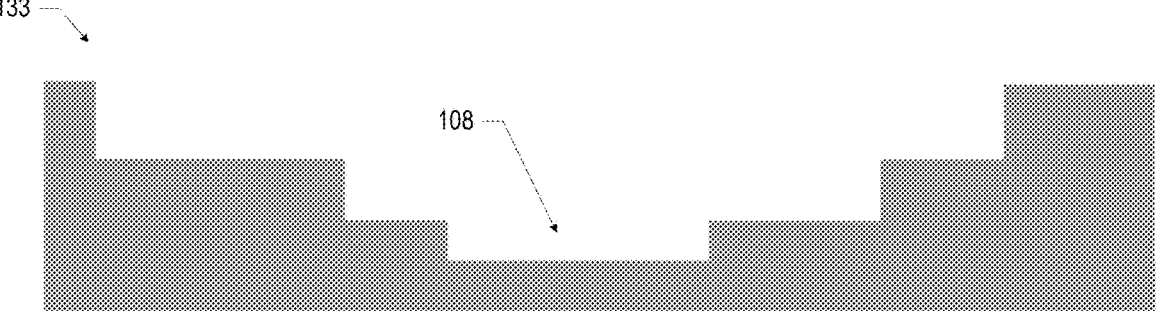
FIG. 5B-4

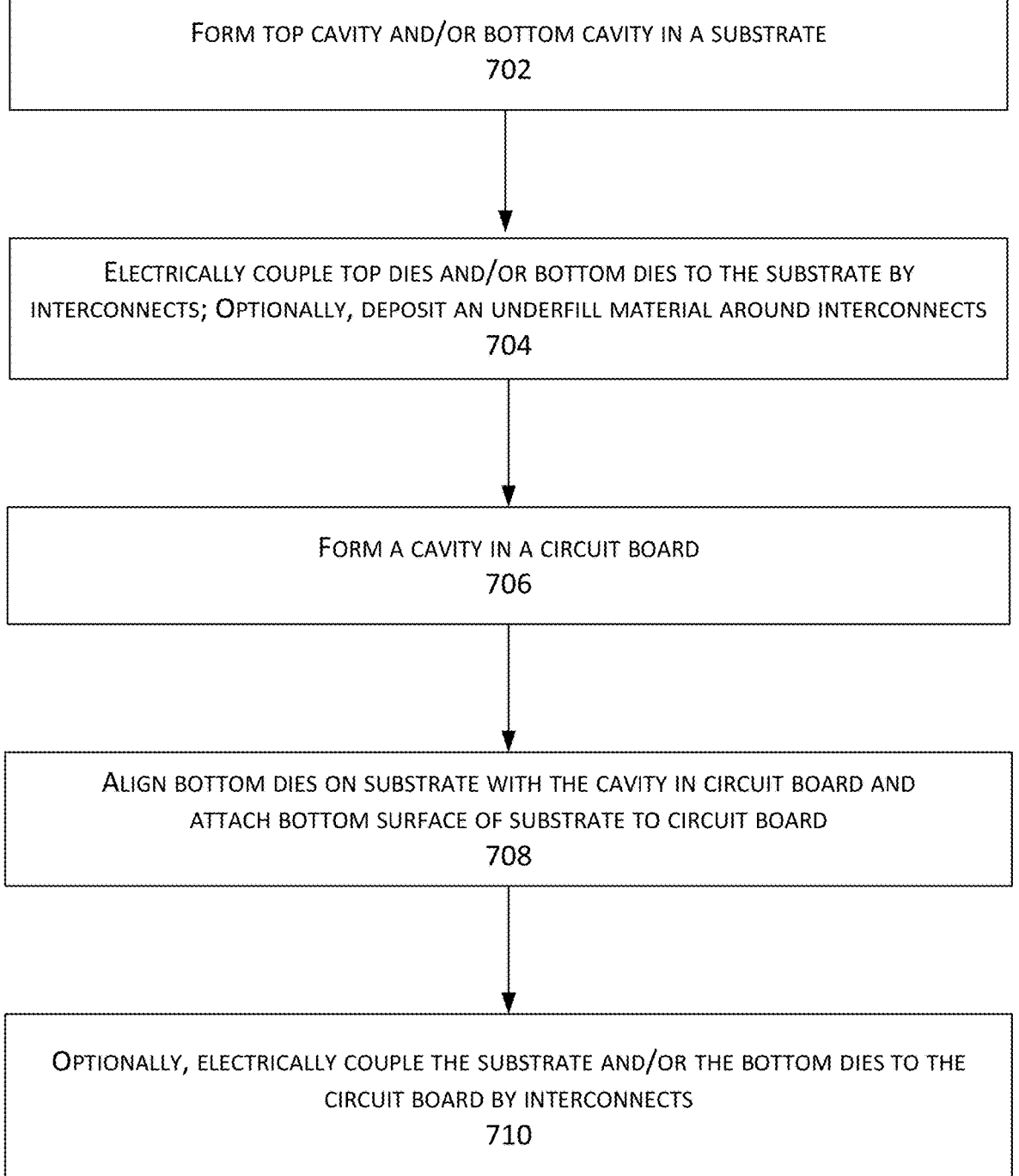

FORM TOP CAVITY AND/OR BOTTOM CAVITY IN A SUBSTRATE
702

ELECTRICALLY COUPLE TOP DIES AND/OR BOTTOM DIES TO THE SUBSTRATE BY INTERCONNECTS; OPTIONALLY, DEPOSIT AN UNDERFILL MATERIAL AROUND INTERCONNECTS
704

FORM A CAVITY IN A CIRCUIT BOARD
706

ALIGN BOTTOM DIES ON SUBSTRATE WITH THE CAVITY IN CIRCUIT BOARD AND ATTACH BOTTOM SURFACE OF SUBSTRATE TO CIRCUIT BOARD
708

OPTIONALLY, ELECTRICALLY COUPLE THE SUBSTRATE AND/OR THE BOTTOM DIES TO THE CIRCUIT BOARD BY INTERCONNECTS
710

FIG. 7

INTEGRATED CIRCUIT PACKAGES HAVING REDUCED Z-HEIGHT

BACKGROUND

Mobile, tablet, ultrabook, and other portable devices based on semiconductor technology are trending towards increasingly reduced dimensions, including thinner form factors. Components are typically mounted on the surfaces of a substrate as well as a circuit board, and, as such, the overall thickness of the integrated circuit (IC) package is generally determined by the z-height of the components.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 is a side, cross-sectional view of an exemplary microelectronic assembly, in accordance with various embodiments.

FIGS. 5A-1 through 5A-4 are schematic illustrations of side views of an exemplary procedure for forming cavities in a substrate, in accordance with various embodiments.

FIGS. 5B-1 through 5B-4 are schematic illustrations of side views of an exemplary procedure for forming cavities in a circuit board, in accordance with various embodiments.

FIG. 7 is a flow chart of an exemplary method for fabricating a microelectronic assembly, in accordance with various embodiments.

DETAILED DESCRIPTION

Figure 2:
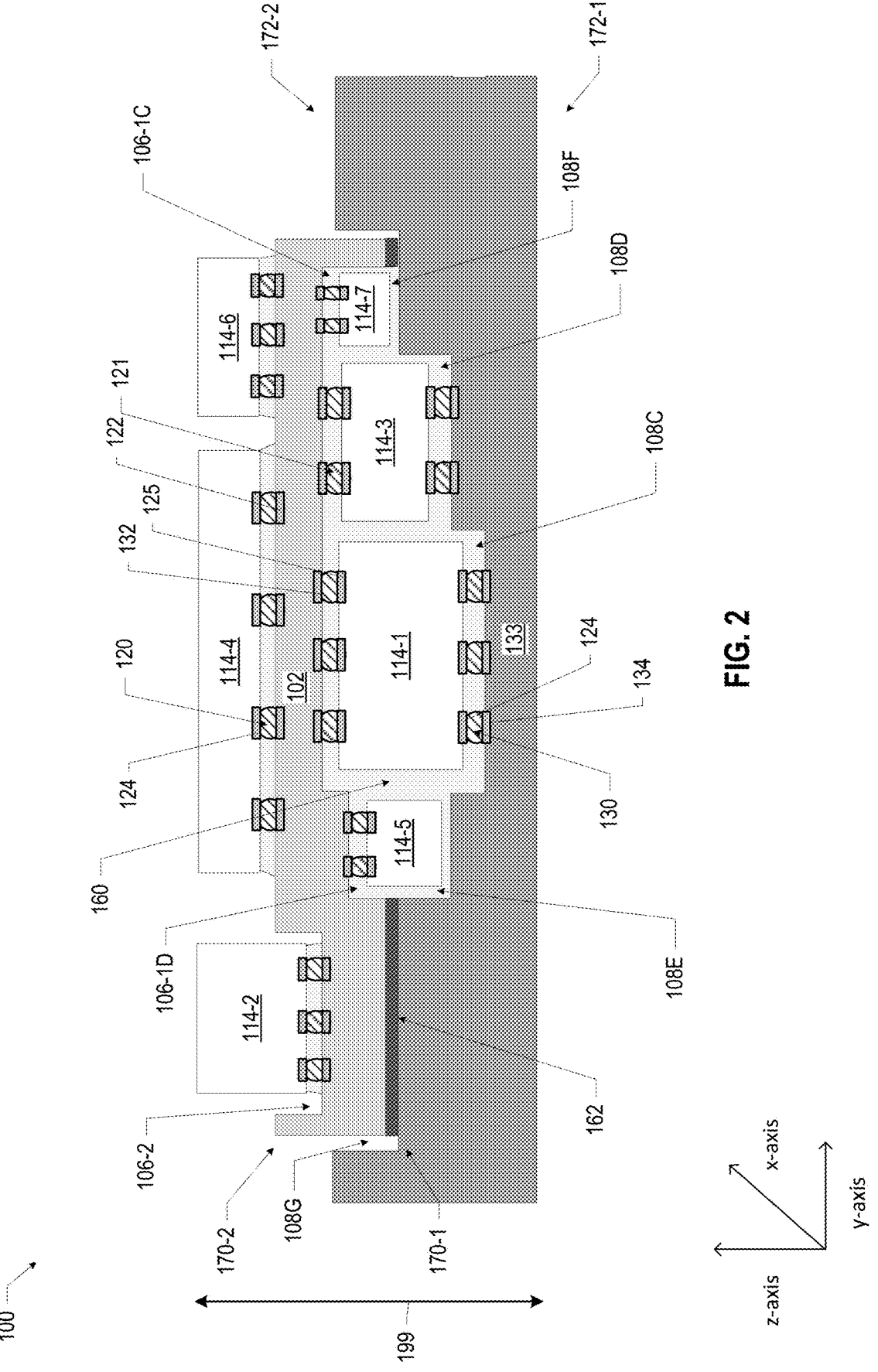
FIG. 2 is a side, cross-sectional view of an exemplary microelectronic assembly, in accordance with various embodiments.

Disclosed herein are microelectronic assemblies, as well as related apparatuses and methods. For example, in some embodiments, a microelectronic assembly may include a substrate having a surface including a first cavity; a first die at least partially nested in the first cavity and electrically coupled to the substrate; and a circuit board having a surface including a second cavity, wherein the surface of the substrate is electrically coupled to the surface of the circuit board, and wherein the first die extends at least partially into the second cavity in the circuit board.

Communicating large numbers of signals between two or more dies in a multi-die IC package is challenging due to the increasingly small size of such dies, thermal constraints, and power delivery constraints, among others. A substrate may be used to mechanically support and electrically connect an electrical component, such as a die. A substrate may be single-sided, where components are attached on a top or bottom surface, or double-sided, where components are attached on both the top and bottom surfaces. Some conventional IC packages may include two or more active dies (i.e., two or more semiconductor devices, such as processors, controllers, logic devices, and memory devices) attached to the top and bottom surfaces of a substrate. In some conventional IC packages, two or more dies are stacked, one on top of the other on the surface of the substrate. The package may include interconnections to provide power to the semiconductor dies within the package, as well as to enable transfer of data to and from the dies. Without the stacking of dies, data interconnections between active dies (i.e., in different packages) typically require long interlinks through conductive layers of a package substrate or a circuit board, such as a motherboard. These long interconnect distances increase inductance and may reduce signal performance. However, stacking of dies, attaching dies on both surfaces of the substrate, and attaching the substrate to a circuit board may increase the overall z-height of a package and may increase thermal and/or mechanical stress on bottom dies.

The exemplary IC packages disclosed herein provide for minimized overall z-height. By incorporating cavities for die attach in the substrate and corresponding cavities in the circuit board, the overall combined thickness or z-height of the substrate, the circuit board and the components may be minimized. For example, the die-attach plane of the substrate and the circuit board may be lowered by including cavities for nesting taller components. Various ones of the embodiments disclosed herein may help achieve reliable attachment of multiple dies at a lower cost, with improved power efficiency, with higher bandwidth, and/or with greater design flexibility, relative to conventional approaches. Further, various ones of the microelectronic assemblies disclosed herein may exhibit better power delivery and signal speed while reducing the size of the package relative to conventional approaches. The microelectronic assemblies disclosed herein may be particularly advantageous for small and low-profile, compute-intensive applications in computers, tablets, industrial robots, and consumer electronics (e.g., wearable devices).

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. The accompanying drawings are not necessarily drawn to scale. Although many of the drawings illustrate rectilinear structures with flat walls and right-angle corners, this is simply for ease of illustration, and actual devices made using these techniques will exhibit rounded corners, surface roughness, and other features.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die," an "IC die," "a microelectronic component," and "an electrical component." The terms "top" and "bottom" may be used herein to explain various features of the drawings, but these terms are simply for ease of discussion, and do not imply a desired or required orientation. As used herein, the term "insulating" means "electrically insulating," unless otherwise specified. Throughout the specification, and in the claims, the term "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

When used to describe a range of dimensions, the phrase "between X and Y" represents a range that includes X and Y. For convenience, the phrase "FIG. 3" may be used to refer to the collection of drawings of FIGS. 3A and 3B, the phrase "FIG. 4" may be used to refer to the collection of drawings of FIGS. 4A and 4B, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

An "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "metal traces," "lines," "metal lines," "wires," "metal wires," "trenches," or "metal trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias.

Figure 1:
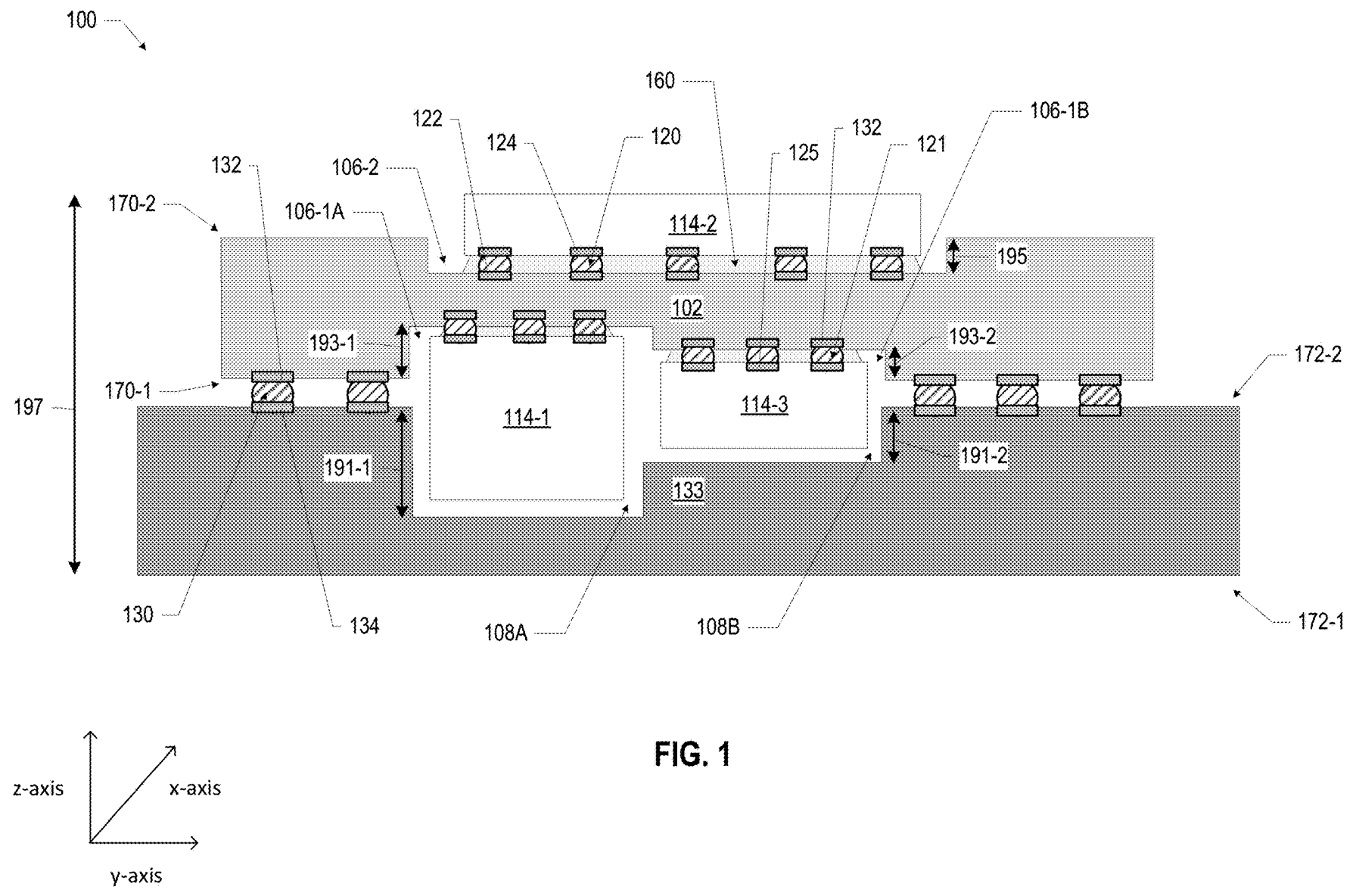

FIG. 1 is a side, cross-sectional view of an exemplary microelectronic assembly 100, in accordance with various embodiments. The microelectronic assembly 100 may include a substrate 102 having cavities 106 with dies 114 disposed therein coupled to a circuit board 133 having complementary cavities 108 for housing the dies 114. The substrate 102 may have a bottom surface (e.g., a first surface 170-1) with a cavity 106-1 (e.g., the cavity 106-1 including cavities 106-1A and 106-1B) and an opposing top surface (e.g., a second surface 170-2) with a cavity 106-2. The dies 114-1, 114-3 may be at least partially nested in the cavity 106-1 and electrically coupled to the bottom surface 170-1 of the substrate 102 by interconnects 121. The dies 114-1, 114-3 may extend, at least partially, into a corresponding cavity 108 in the circuit board 133 (e.g., the cavity 108 including cavities 108A and 108B). The die 114-2 may be at least partially nested in the cavity 106-2 and electrically coupled to the top surface 170-2 of the substrate 102 by interconnects 120. The cavity 106, 108 may include a single cavity (e.g., as shown for cavity 106-2) or may include multiple cavities (e.g., as shown for cavity 106-1 and cavity 108), where the cavity 106-1, 108 includes steps or tiers forming cavities having different depths (e.g., z-heights). As used herein, the term "cavity" may refer to an opening having substantially perpendicular sidewalls or may refer to an opening having stepped sidewalls such that the opening has a terraced- or tiered-contour. For example, the cavity 106-2 is single cavity having a depth 195, the cavity 108 includes a first cavity 108A having a first depth 191-1 and a second cavity 108B having a second depth 191-2, and the cavity 106-1 includes a first cavity 106-1A having a first depth 193-1 and a second cavity 1061-B having a second depth 193-2. By housing the dies 114 in the cavities 106, 108, the overall thickness (e.g., z-height) of the microelectronic assembly 100 may be reduced. For example, an overall z-height of a conventional microelectronic assembly (i.e., without cavities) may be equal to a sum of a height of the circuit board, a greatest height of a bottom die, a height of the substrate, and a greatest height of a top die (e.g., the height of the circuit board plus the height of die 114-1 plus the height of the substrate 102 plus the height of the die 114-2). The overall thickness 197 of the microelectronic assembly 100 is equal to a sum of the height of the circuit board 133, the height of the substrate 102, and the height of a portion of a die 114-2 extending above the top surface 170-2 of the substrate 102.

In particular, the substrate 102 may have conductive contacts 132 on a bottom surface 170-1 and conductive contacts 122 on a top surface 170-2. In some embodiments, the conductive contacts 122, 132 on the substrate 102 may be within a cavity 106. The dies 114-1, 114-3 may have conductive contacts 125 on a top surface. The conductive contacts 125 on the top surface of the dies 114-1, 114-3 may be electrically coupled to the conductive contacts 132 on the bottom surface 170-1 of the substrate 102 by interconnects 121. The die 114-2 may have conductive contacts 124 on a bottom surface. The conductive contacts 124 on the bottom surface of the die 114-2 may be electrically coupled to the conductive contacts 122 on the top surface 170-2 of the substrate 102 by interconnects 120. The interconnects 120, 121 may be surrounded by an underfill material 160 (e.g., the underfill material 160 may be disposed between the dies 114 and the respective first or second surface 170-1, 170-2 of the substrate 102). The circuit board 133 may have a bottom surface (e.g., a first surface 172-1) and conductive contacts 134 on an opposing top surface (e.g., a second surface 172-2). The top surface 172-2 of the circuit board 133 may include the cavity 108. The conductive contacts 132 on the bottom surface 170-1 of the substrate 102 may be electrically coupled to the conductive contacts 134 on the top surface 172-2 of the circuit board 133 by interconnects 130. In some embodiments, one or more of the interconnects 120, 121, 130 may include solder bumps or balls (as illustrated in FIG. 1); in other embodiments, the one or more interconnects 120, 121, 130 may include copper pillars, wirebonds, metal-to-metal interconnects, or any other suitable interconnects. In some embodiments, the one or more interconnects 120, 121, 130 may be surrounded by an underfill material 160. The underfill material 160 may be any suitable material. The underfill material 160 may be an insulating material, such as an appropriate epoxy material. In some embodiments, the underfill material 160 may include a capillary underfill, non-conductive film (NCF), or molded underfill. The underfill material 160 may be selected to have a CTE that may mitigate or minimize the stress between the die 114 and the substrate 102. In some embodiments, the underfill material 160 may include an epoxy flux that assists with soldering the die 114 to the substrate 102 and the substrate 102 to the circuit board 133 when forming the interconnects 120, 121, 130, respectively, and then polymerizes and encapsulates the interconnects 120, 121, 130. In some embodiments, the CTE of the underfill material 160 may have a value that is intermediate to the CTE of the substrate 102 (e.g., the CTE of the dielectric material of the substrate 102) and a CTE of the die 114 and/or the CTE of the circuit board 133. In some embodiments, the one or more interconnects 120, 121, 130 may include an anisotropic conductive material, such as an anisotropic conductive film or an anisotropic conductive paste. An anisotropic conductive material may include conductive materials dispersed in a non-conductive material.

The dies 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 9. The conductive pathways in the dies 114 may be bordered by liner materials, such as adhesion liners and/or barrier liners, as suitable.

The substrate 102 may include an insulating material (e.g., a dielectric material formed in multiple layers, as known in the art) and one or more conductive pathways (not shown) to route power, ground, and signals through the dielectric material (e.g., including conductive traces and/or conductive vias, as shown). In some embodiments, the insulating material of the substrate 102 may be a dielectric material, such as an organic dielectric material, a fire retardant grade 4 material (FR-4), BT resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). In particular, when the substrate 102 is formed using standard printed circuit board (PCB) processes, the substrate 102 may include FR-4, and the conductive pathways in the substrate 102 may be formed by patterned sheets of copper separated by build-up layers of the FR-4. The conductive pathways in the substrate 102 may be bordered by liner materials, such as adhesion liners and/or barrier liners, as suitable. In some embodiments, the substrate 102 may be a coreless substrate, a UTC substrate, a wafer level packaging, or any other suitable package designed to minimize z-height, as is known in the art. The substrate 102 may include conductive pathways (not shown) that allow power, ground, and other electrical signals to move between the die 114 and the substrate 102. In some embodiments, the die 114 and stiffener 180 may not be coupled to a substrate 102, but may instead be coupled to an interposer, a package substrate, or a circuit board, such as a PCB.

In some embodiments, the substrate 102 may be formed using a lithographically defined via packaging process. In some embodiments, the substrate 102 may be manufactured using standard organic package manufacturing processes, and thus the substrate 102 may take the form of an organic package. In some embodiments, the substrate 102 may be a set of redistribution layers formed on a panel carrier by laminating or spinning on a dielectric material, and creating conductive vias and lines by laser drilling or ablation and plating. In some embodiments, the substrate 102 may be formed on a removable carrier using any suitable technique, such as a redistribution layer technique. Any method known in the art for fabrication of the substrate 102 may be used, and for the sake of brevity, such methods will not be discussed in further detail herein.

In some embodiments, the substrate 102 may be a lower density medium and the die 114 (e.g., the die 114-1, 114-2, 114-3) may be a higher density medium or have an area with a higher density medium. As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process). In other embodiments, the higher density medium may be manufactured using semiconductor fabrication process, such as a single damascene process or a dual damascene process.

The microelectronic assembly 100 may further include a circuit board 133. The first conductive contacts 134 on the first surface 170-1 of the substrate 102 may be coupled to conductive contacts 132 on a surface of the circuit board 133 via interconnects 130. In some embodiments, the interconnects 130 may include solder balls (as illustrated in FIG. 1) for a ball grid array (BGA) coupling; in other embodiments, the interconnects 130 may include solder paste contacts to provide land grid array (LGA) interconnects, or any other suitable interconnect. In some embodiments, the circuit board 133 may include one or more components disposed thereon (not shown). The circuit board 133 may include conductive pathways (not shown) that allow power, ground, and other electrical signals to move between the circuit board 133 and the substrate 102 as well as between the circuit board 133 and the dies 114, as known in the art. In some embodiments, the circuit board 133 may be a PCB including multiple metal layers separated from one another by layers of dielectric material and interconnected by electrically conductive vias. In other embodiments, circuit board 133 may be a non-PCB substrate.

Although three dies 114 and three cavities 106, 108 are illustrated in FIG. 1, this is simply an example, and the microelectronic assembly 100 may include one or more dies 114 and one or more cavities 106, 108. The cavities 106, 108 in the microelectronic assembly 100 may be designed and configured to optimize (e.g., decrease) an overall thickness and may depend on the number, type, and arrangement of dies 114, and on the number, type, and arrangement of substrates 102 and circuit boards 133. The dies may perform any suitable functionality, and may include processing devices, memory, communications devices, sensors, or any other computing components or circuitry. For example, the dies may include a central processing unit (CPU), a platform controller hub (PCH), a dynamic random access memory (DRAM), a graphic processing unit (GPU), and a field programmable gate array (FPGA).

Although FIG. 1 illustrates a single IC package (e.g., substrate 102 with dies 114) disposed on the circuit board 133, this is simply for ease of illustration and multiple IC packages with multiple dies may be disposed on the circuit board 133. In some embodiments, the circuit board 133 may be a PCB (e.g., a motherboard). In some embodiments, the circuit board 133 may be an interposer, and the microelectronic assembly 100 may be a package-on-interposer structure.

Many of the elements of the microelectronic assembly 100 of FIG. 1 are included in other ones of the accompanying figures; the discussion of these elements is not repeated when discussing these figures, and any of these elements may take any of the forms disclosed herein. Some of the elements of the microelectronic assembly 100 of FIG. 1 are not included in other ones of the accompanying figures for simplicity, but a microelectronic assembly 100 may include these omitted elements. In some embodiments, individual ones of the microelectronic assemblies 100 disclosed herein may serve as a system-in-package (SiP) in which multiple dies 114 having different functionality are included. In such embodiments, the microelectronic assembly 100 may be referred to as an SiP.

FIG. 2 is a side, cross-sectional view of another exemplary microelectronic assembly 100, in accordance with various embodiments. The microelectronic assembly 100 may include a substrate 102 having cavities 106 with dies 114 disposed therein coupled to a circuit board 133 having complementary cavities 108 (e.g., the cavity 108 including cavities 108C, 108D, 108E, 108F, and 108G) for housing the dies 114. The circuit board 133 may further have a cavity 108 (e.g., cavity 108F, 108G) for nesting the substrate 102. As shown in FIG. 2, the substrate 102 may have a bottom surface 170-1 that may be coupled to the cavity 108 (e.g., cavity 108F, 108G) of the circuit board 133 by an adhesive 162, or other similar material (e.g., a thermally set adhesive dispensed in liquid, semi-liquid, or preformed formats). The substrate 102 may have a bottom surface (e.g., a first surface 170-1) with a cavity 106-1 (e.g., the cavity 106-1 including cavities 106-1C and 106-1D) and an opposing top surface (e.g., a second surface 170-2) with a cavity 106-2. The dies 114-1, 114-3, 114-5, 114-7 may be at least partially nested in the cavity 106-1 (e.g., the cavity 106-1 including cavities 106-1C and 106-1D) and electrically coupled to the bottom surface 170-1 of the substrate 102 by interconnects 121. In particular, the dies 114-1, 114-3, 114-7 may be partially nested in cavity 106-1C and die 114-5 may be partially nested in cavity 106-1D. The dies 114-1, 114-3, 114-5, 114-7 may extend, at least partially, into a corresponding cavity 108 (e.g., the cavity 108 including cavities 108C, 108D, 108E, 108F, and 108G) in the circuit board 133. For example, the die 114-1 may at least partially extend into cavity 108C, the die 114-3 may at least partially extend into cavity 108D, the die 114-5 may at least partially extend into cavity 108E, and the die 114-7 may at least partially extend into cavity 108F. The cavities 106-1, 108 may include steps or tiers forming internal cavities having different depths (e.g., z-heights). The dies 114-1, 114-3 further may be electrically coupled to the circuit board 133. The dies 114-1, 114-3 may have conductive contacts 124 on a bottom surface. The conductive contacts 124 on the bottom surface of the dies 114-1, 114-3 may be electrically coupled to the conductive contacts 134 on the top surface 172-2 of the circuit board 133 by interconnects 130. The conductive contacts 134 on the circuit board 133 may be within a cavity 108 (e.g., cavity 108C, 108D). In some embodiments, the dies 114-1, 114-3, 114-5, 114-7 and the interconnects 121, 130 may be surrounded by an underfill material 160. The underfill material may be any suitable material, such as described above with reference to FIG. 1. The die 114-2 may be at least partially nested in the cavity 106-2 and electrically coupled to the top surface 170-2 of the substrate 102 by interconnects 120. The dies 114-4, 114-6 may be coupled to a top surface 170-2 of the substrate 102 by interconnects 120. In some embodiments, the interconnects 120 may be surrounded by an underfill material 160. By housing the substrate 102 in cavity 108 and the dies 114 in the cavities 106, 108, the overall thickness 199 (e.g., z-height) of the microelectronic assembly 100 may be reduced.

Figures 3A, 3B:
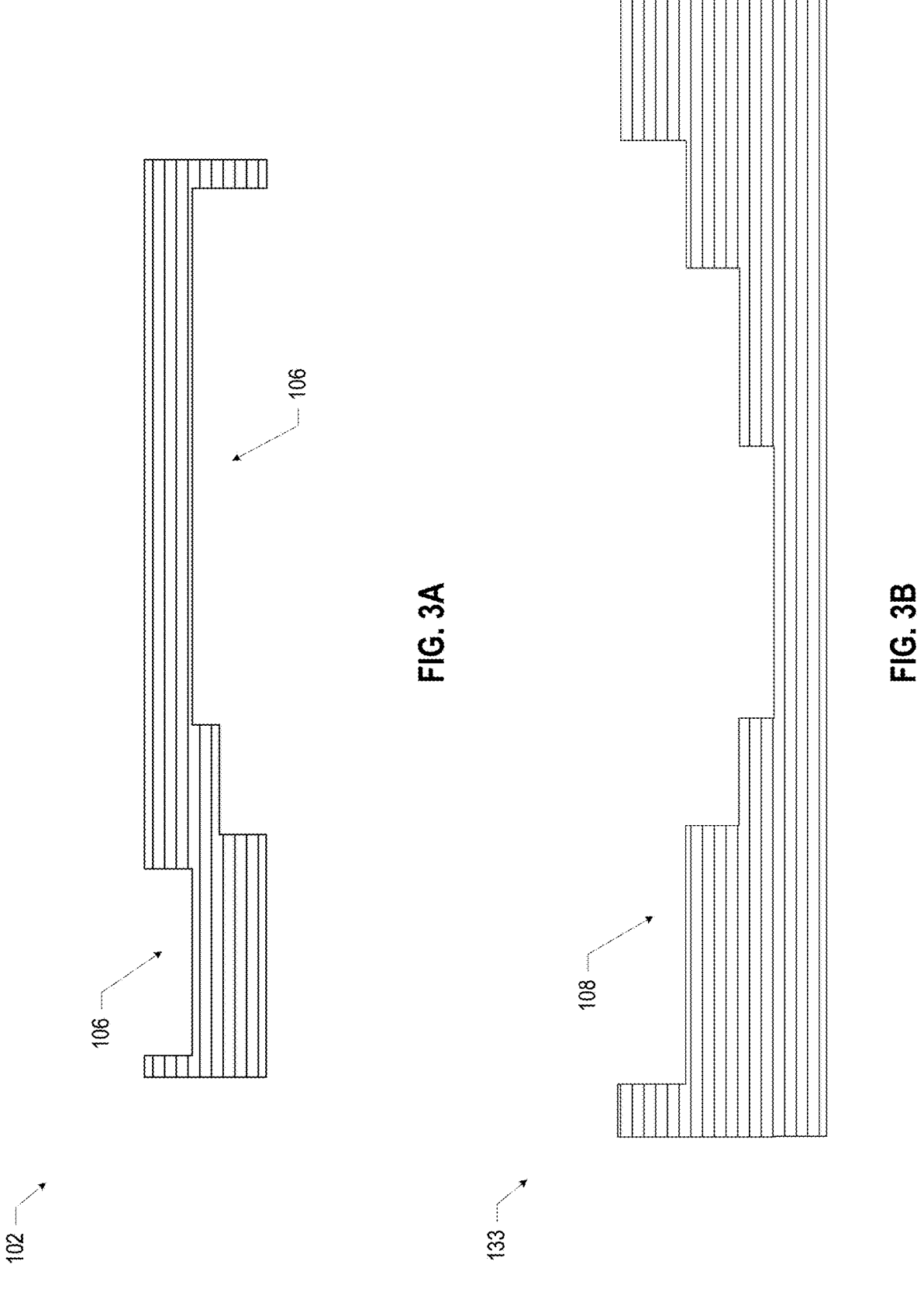
FIG. 3A is a schematic illustration of a side view of a substrate having layers forming cavities, in accordance with various embodiments.
FIG. 3B is a schematic illustration of a side view of a circuit board having layers forming cavities, in accordance with various embodiments.

The cavities 106 in the substrate 102 and the cavities 108 in the circuit board 133 of the microelectronic assemblies 100 may be formed using any suitable techniques, for example, any of the techniques shown in FIGS. 3-5. FIG. 3A is a schematic illustration of a side view of a substrate having lamination layers forming cavities, in accordance with various embodiments. FIG. 3B is a schematic illustration of a side view of a circuit board having lamination layers forming cavities, in accordance with various embodiments. FIGS. 3A and 3B depict that the cavities 106 in the substrate 102 and the cavities 108 in the circuit board 133 may be formed by laminating layers with pre-cut openings to form the cavities 106, 108.

Figures 4A, 4B:
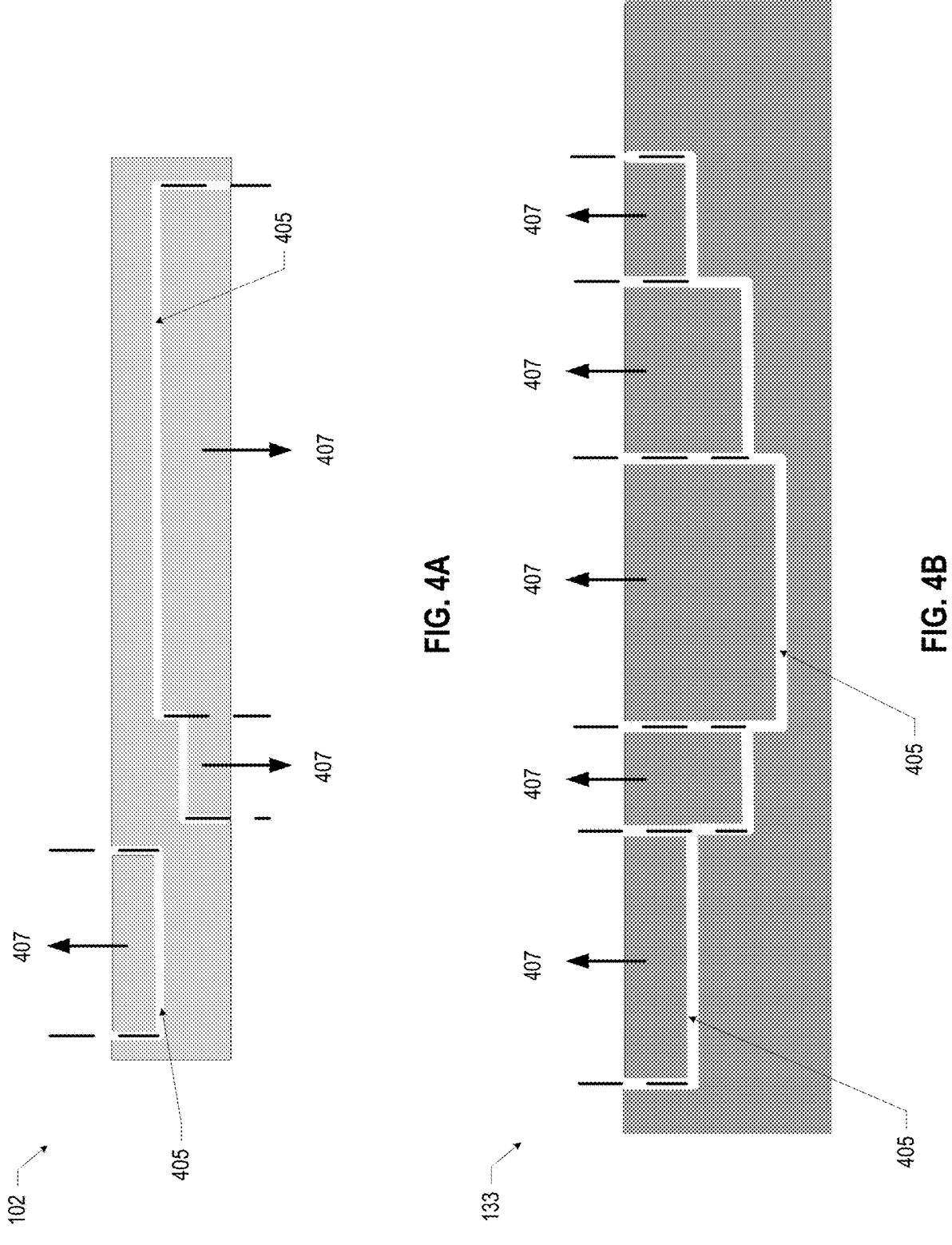
FIG. 4A is a schematic illustration of a side view of an exemplary procedure for forming cavities in a substrate, in accordance with various embodiments.
FIG. 4B is a schematic illustration of a side view of an exemplary procedure for forming cavities in a circuit board, in accordance with various embodiments.

FIG. 4A is a schematic illustration of a side view of an exemplary procedure for forming cavities in a substrate, in accordance with various embodiments. FIG. 4B is a schematic illustration of a side view of an exemplary procedure for forming cavities in a circuit board, in accordance with various embodiments. FIGS. 4A and 4B show that the cavities 106 in the substrate 102 and the cavities 108 in the circuit board 133 may be formed by cutting 403 (e.g., by laser cutting) to a release layer 405 and removing a material 407 of the substrate 102 and the circuit board 133. The release layer 405 may be at different depths to form stepped or tiered cavities. In some embodiments, the cavities 106 in the substrate 102 and the cavities 108 in the circuit board 133 may be formed by laser skiving, which is a selective ablation process that may remove one material with or without affecting an underlying material (e.g., selectively etching a material in a controlled order of energy delivery across the material surface for detecting a material boundary or controlling depth).

Figures 5A-1, 5A-2, 5A-3, 5A-4:
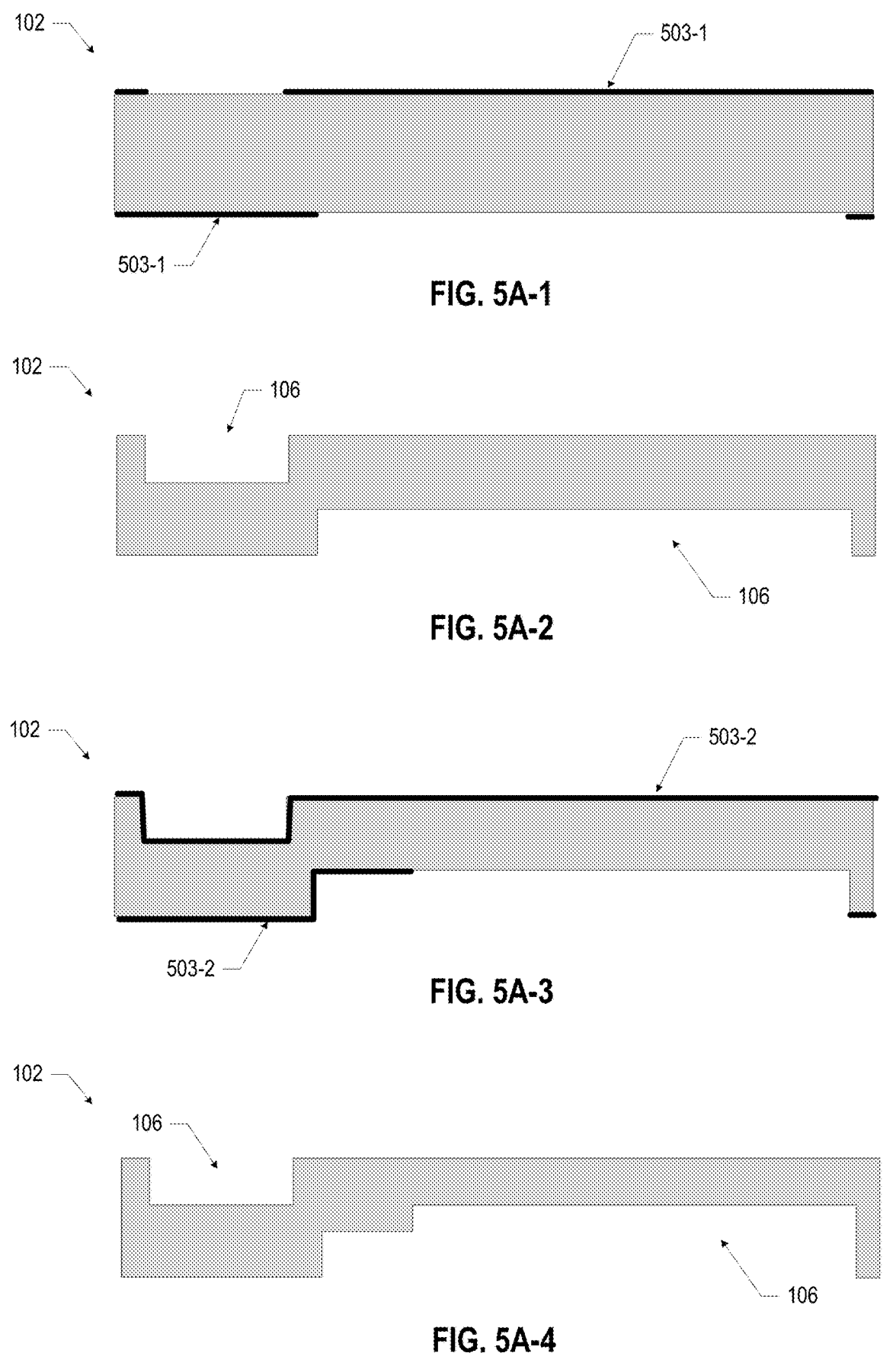

FIGS. 5A-1 through 5A-4 are schematic illustrations of side views of an exemplary procedure for forming cavities in a substrate, in accordance with various embodiments. FIGS. 5B-1 through 5B-4 are schematic illustrations of side views of an exemplary procedure for forming cavities in a circuit board, in accordance with various embodiments. FIGS. 5A and 5B show that the cavities 106 in the substrate 102 and the cavities 108 in the circuit board 133 may be formed by successively etching to multiple depths. Although FIG. 5A illustrate cavities being formed simultaneously on a top and a bottom surface, in some embodiments, the cavities may be formed on a surface (e.g., a top surface or a bottom surface) and subsequently formed on an opposing surface. FIG. 5A-1 illustrates a first etch-resistant material 503-1, such as solder resist, coated on surfaces of the substrate 102 to protect areas of the substrate 102 from removal. FIG. 5A-2 shows the creation of cavities 106 (e.g., openings) that are formed by removing material from the exposed portions of the surface of the substrate 102 and the first etch-resistant material 503-1 stripped or removed from the substrate 102. The cavities 106 may be formed using standard lithographic processes as is known in the art. In some embodiments, the cavities 106 may be created in areas of the substrate 102 that do not include conductive pathways or other metal layers, such that only dielectric material may be etched. In other embodiments, the cavities 106 may be in areas of the substrate 102 that include metal, such that dielectric and metal material may be etched. FIG. 5A-3 illustrates a second etch-resistant material 503-2 coated on surfaces of the substrate 102 to protect areas of the substrate 102 from removal. FIG. 5A-4 shows the creation of cavities 106 (e.g., openings) with greater depths (e.g., z-height) that are formed by further removing material from the exposed portions of the surface of the substrate 102 and the second etch-resistant material 503-2 stripped or removed from the substrate 102. As shown in FIG. 5A, the etch-resistant material 503 may be removed or stripped after each etching. FIG. 5B-1 illustrates a first etch-resistant material 503-1, such as solder resist, coated on a surface of the circuit board 133 to protect areas of the circuit board from removal. FIG. 5B-2 shows the creation of a cavity 108 (e.g., an opening) that is formed by removing material from the exposed portions of the surface of the circuit board 133. The cavity 108 may be formed using standard lithographic processes as is known in the art. In some embodiments, the cavity 108 may be created in areas of the circuit board 133 that do not include conductive pathways or other metal layers, such that only dielectric material may be etched. In other embodiments, the cavity 108 may be in areas of the circuit board 133 that include metal, such that dielectric and metal material may be etched. FIG. 5B-2 further illustrates a second etch-resistant material 503-2 coated on the surface of the circuit board 133. The second etch-resistant material 503-2 may be coated in addition to the first etch-resistant material 503-1 (e.g., the first etch-resistant material 503-1 may not be removed after etching). FIG. 5B-3 shows the creation of cavity 108 having a greater depth (e.g., z-height) that is formed by further removing material from the exposed portions of the surface of the circuit board 133. FIG. 5B-3 further illustrates a third etch-resistant material 503-3 coated on the surface of the circuit board 133. The third etch-resistant material 503-3 may be coated in addition to the first and second etch-resistant materials 503-1, 503-2 (e.g., the first and second etch-resistant materials 503-1, 503-2 may not be removed after etching). FIG. 5B-4 shows the creation of cavity 108 having another greater depth (e.g., z-height) that is formed by further removing material from the exposed portions of the surface of the circuit board 133 not covered by the third etch-resistant material 503-3. FIG. 5B-4 further shows the etch-resistant material 503 stripped or removed from the circuit board 133. Although FIG. 5B shows the previous etch-resistant material 503 as not being removed after each etching, the pervious etch-resistant material 503 may be removed or stripped after each etching and newly applied for the subsequent etching.

Figures 6A, 6B:
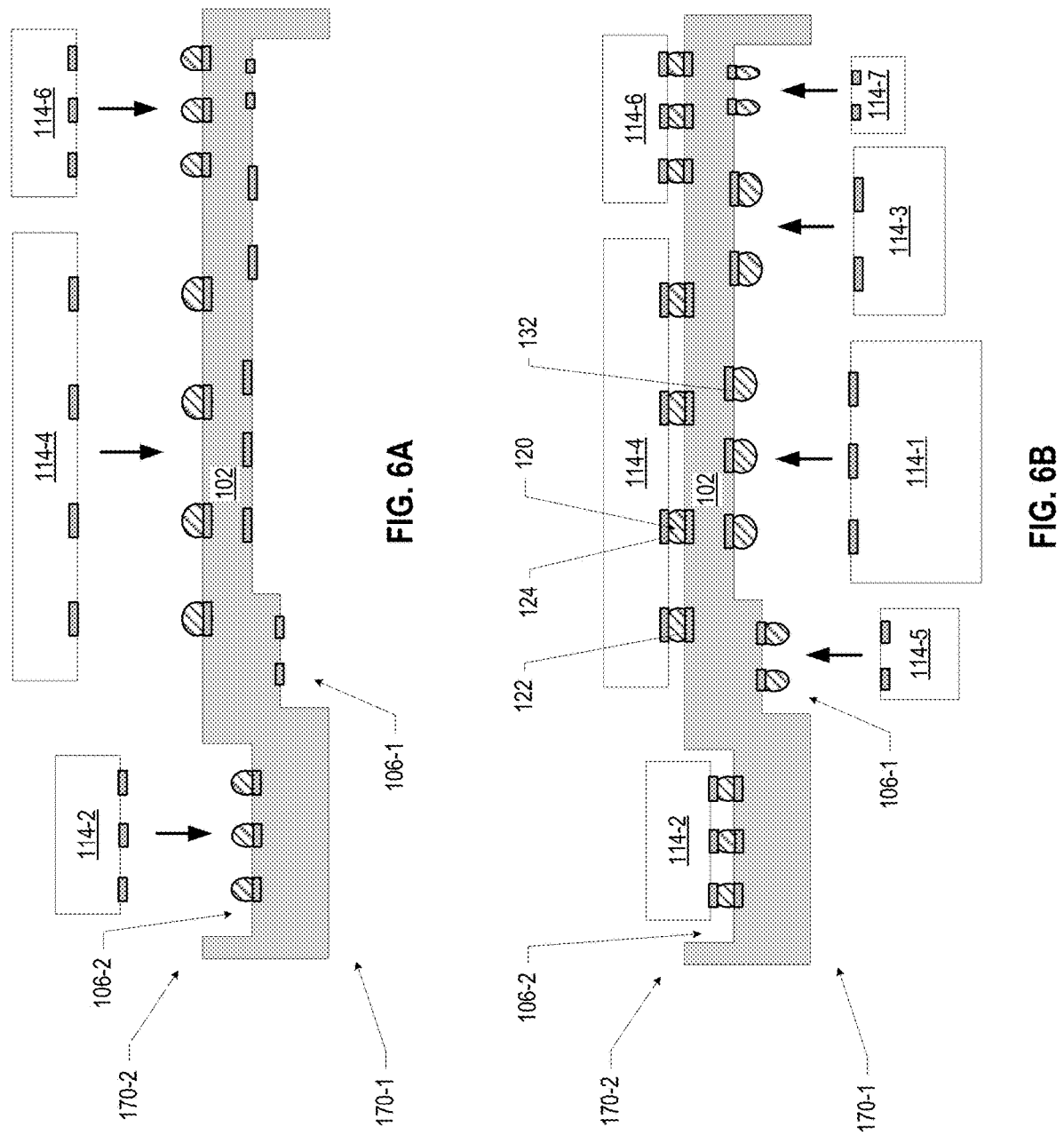
FIGS. 6A-6D are side, cross-sectional views of an exemplary process for manufacturing a microelectronic assembly, in accordance with various embodiments.

FIGS. 6A-6D are side, cross-sectional views of an exemplary process for manufacturing a microelectronic assembly, in accordance with various embodiments. FIG. 6A illustrates a substrate 102 subsequent to forming cavities 106 (e.g., cavities 106-1, 106-2 on respective first and second surface 170-1, 170-2 of the substrate 102) and aligning top dies 114-2, 114-4, 114-6 for mounting on the top surface 170-2 of the substrate 102. The cavities 106 may be formed using any suitable technique, such as any of the techniques described above with reference to FIGS. 3-5. The top dies 114 may be aligned and placed using any suitable process, such as pick and place tooling.

FIG. 6B illustrates an assembly subsequent to electrically coupling top dies 114-2, 114-4, 114-6 to the substrate 102 by forming interconnects 120 and aligning bottom dies 114-1, 114-3, 114-5, 114-7 for mounting on the bottom surface 170-1 of the substrate 102. In some embodiments, the interconnects 120 may include solder. In such embodiments, the assembly of FIG. 6B may be subjected to a solder reflow process during which solder components of the interconnects 120 melt and bond to mechanically and electrically couple the dies 114-2, 114-4, 114-6 to the top surface 170-2 of the substrate 102. In some embodiments, an underfill material 160 (not shown) may be dispensed around the interconnects 120 using any suitable process. The bottom dies 114 may be aligned and placed using any suitable process, such as pick and place tooling.

Figures 6C, 6D:

FIG. 6C illustrates an assembly subsequent to electrically coupling bottom dies 114-1, 114-3, 114-5, 114-7 to the substrate 102 by forming interconnects 121. In some embodiments, the interconnects 121 may include solder. In such embodiments, the assembly of FIG. 6C may be subjected to a solder reflow process during which solder components of the interconnects 120 melt and bond to mechanically and electrically couple the dies 114-1, 114-3, 114-5, 114-7 to the bottom surface 170-1 of the substrate 102. In some embodiments, an underfill material 160 may be dispensed around the interconnects 121 using any suitable process. The bottom dies 114 may be aligned and placed using any suitable process, such as pick and place tooling. Further manufacturing operations may be performed on the assemblies of FIGS. 6B and 6C, for example, surface finishing operations, among others.

FIG. 6D illustrates a circuit board 133 subsequent to forming a cavity 108, dispensing an adhesive material 162 on a bottom surface of a cavity 108 and aligning the assembly of FIG. 6C for mounting on the circuit board 133. The cavity 108 may be formed using any suitable technique, such as any of the techniques described above with reference to FIGS. 3-5. The assembly of FIG. 6C may be aligned and placed using any suitable process, such as pick and place tooling. In some embodiments, the adhesive material 162 may be a thermally set adhesive. In such embodiments, the assembly of FIG. 6D may be subjected to a thermal process for curing the adhesive. In some embodiments, an underfill material 160 may be dispensed around the dies 114 (e.g., between the bottom surface 170-1 of the substrate 102 and the top surface 172-2 of the circuit board 133) using any suitable process. Further manufacturing operations may be performed on the microelectronic assembly of FIG. 6D; for example, the conductive contacts 134 with solder (not shown) on a first surface 170-1 of the substrate 102 may be coupled to the circuit board 133 via interconnects 130, similar to the microelectronic assembly 100 of FIG. 1, or conductive contacts 124 on a bottom surface of the bottom dies 114 may be coupled to the circuit board 133 via interconnects 130, similar to the microelectronic assembly 100 of FIG. 2.

FIG. 7 is a flow chart of an exemplary method for fabricating a microelectronic assembly, in accordance with various embodiments. At 702, one or more cavities 106 may be formed on a substrate 102. The one or more cavities 106 may be formed using any suitable technique and may be configured based on die 114 arrangement and the IC package configuration. At 704, top and/or bottom dies 114 may be at least partially nested in the one or more cavities 106 and may be electrically coupled to the substrate 102 by interconnects 120, 121. At 706, one or more cavities 108 may be formed on a circuit board 133. The one or more cavities 108 may be formed using any suitable technique and may be configured based on die 114 arrangement on the substrate 102 and the IC package configuration. At 708, the bottom dies 114 and the substrate 102 may be aligned with the cavities 108 on the circuit board 133 and the substrate 102 may be attached or secured to the circuit board 133. In some embodiments, the substrate 102 may be attached using an adhesive material. At 710, in some embodiments, such as when the substrate 102 is not secured to the circuit board 133 by an adhesive material, the substrate 102 and/or the bottom dies 114 may be electrically coupled to the circuit board by interconnects 130.

The microelectronic assemblies 100 disclosed herein may be included in any suitable electronic component. FIGS. 8-11 illustrate various examples of apparatuses that may include, or be included in, any of the microelectronic assemblies 100 disclosed herein.

Figure 8:
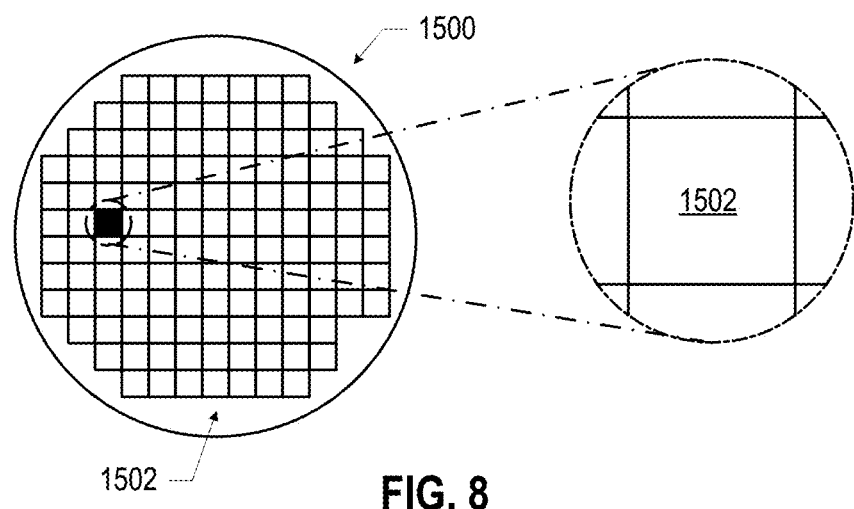
FIG. 8 is a top view of a wafer and dies that may be included in a microelectronic assembly, in accordance with any of the embodiments disclosed herein.

FIG. 8 is a top view of a wafer 1500 and dies 1502 that may be included in any of the microelectronic assemblies 100 disclosed herein (e.g., as any suitable ones of the dies 114). The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the dies 114 disclosed herein. The die 1502 may include one or more transistors (e.g., some of the transistors 1640 of FIG. 9, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a RAM device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 11) or other logic that is configured to store information in the memory devices or execute instructions stored in the memory array. In some embodiments, a die 1502 may be a central processing unit, a radio frequency chip, a power converter, or a network processor. Various ones of the microelectronic assemblies 100 disclosed herein may be manufactured using a die-to-wafer assembly technique in which some dies 114 are attached to a wafer 1500 that include others of the dies 114, and the wafer 1500 is subsequently singulated.

Figure 9:
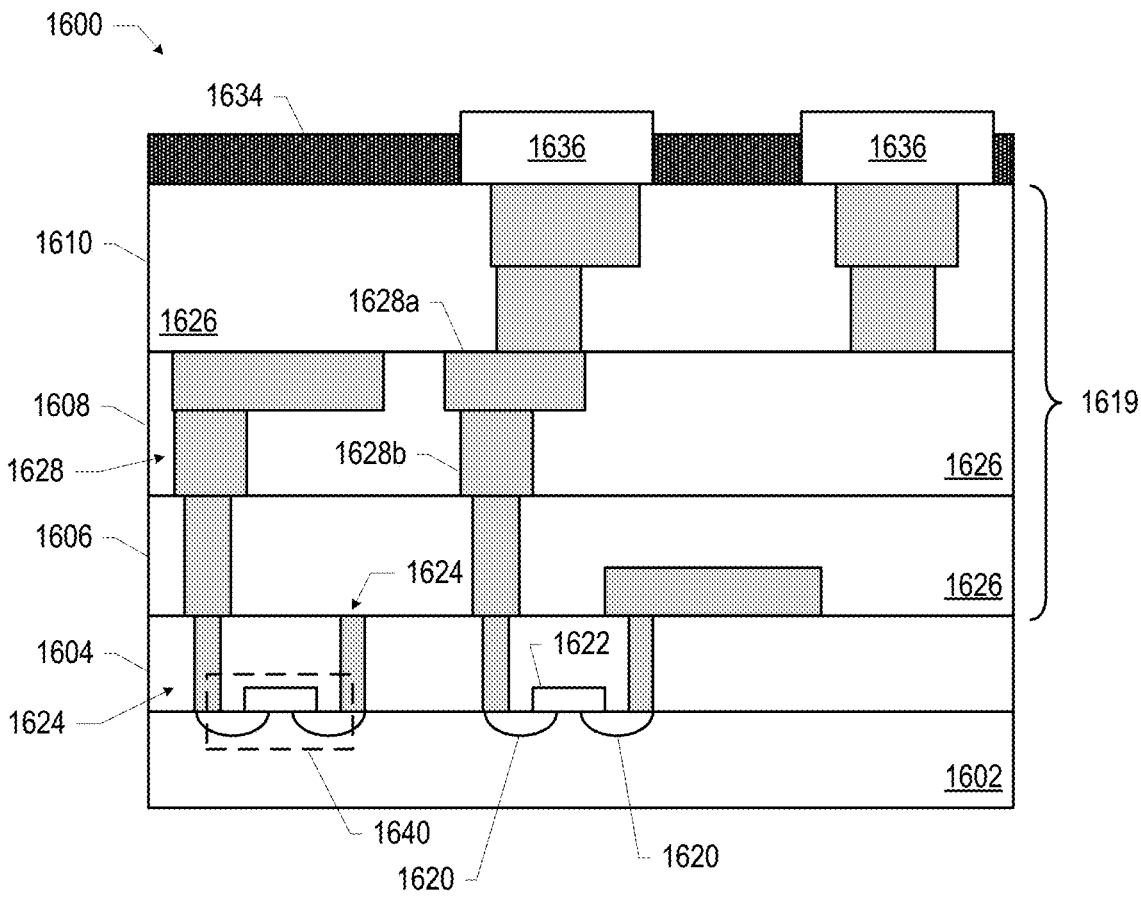
FIG. 9 is a cross-sectional side view of an IC device that may be included in a microelectronic assembly, in accordance with any of the embodiments disclosed herein.

FIG. 9 is a cross-sectional side view of an IC device 1600 that may be included in any of the microelectronic assemblies 100 disclosed herein (e.g., in any of the dies 114). One or more of the IC devices 1600 may be included in one or more dies 1502 (FIG. 8). The IC device 1600 may be formed on a die substrate 1602 (e.g., the wafer 1500 of FIG. 8) and may be included in a die (e.g., the die 1502 of FIG. 8). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 8) or a wafer (e.g., the wafer 1500 of FIG. 8).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 9 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 9 as interconnect layers 1606-1610). For example, electrically conductive features of the device layer 1604 (e.g., the gate 1622 and the S/D contacts 1624) may be electrically coupled with the interconnect pathways 1628 of the interconnect layers 1606-1610. The one or more interconnect layers 1606-1610 may form a metallization stack (also referred to as an "ILD stack") 1619 of the IC device 1600.

The interconnect pathways 1628 may be arranged within the interconnect layers 1606-1610 to route electrical signals according to a wide variety of designs; in particular, the arrangement is not limited to the particular configuration of interconnect pathways 1628 depicted in FIG. 9. Although a particular number of interconnect layers 1606-1610 is depicted in FIG. 9, embodiments of the present disclosure include IC devices having more or fewer interconnect layers than depicted.

In some embodiments, the interconnect pathways 1628 may include lines 1628*a* and/or vias 1628*b* filled with an electrically conductive material such as a metal. The lines 1628*a* may be arranged to route electrical signals in a direction of a plane that is substantially parallel with a surface of the die substrate 1602 upon which the device layer 1604 is formed. For example, the lines 1628*a* may route electrical signals in a direction in and out of the page from the perspective of FIG. 9. The vias 1628*b* may be arranged to route electrical signals in a direction of a plane that is substantially perpendicular to the surface of the die substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect pathways 1628, as shown in FIG. 9. In some embodiments, the dielectric material 1626 disposed between the interconnect pathways 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 9, the conductive contacts 1636 are illustrated as taking the form of bond pads. The conductive contacts 1636 may be electrically coupled with the interconnect pathways 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

In some embodiments in which the IC device 1600 is a double-sided die (e.g., like the die 114-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636.

In other embodiments in which the IC device 1600 is a double-sided die (e.g., like the die 114-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636.

Figure 10:
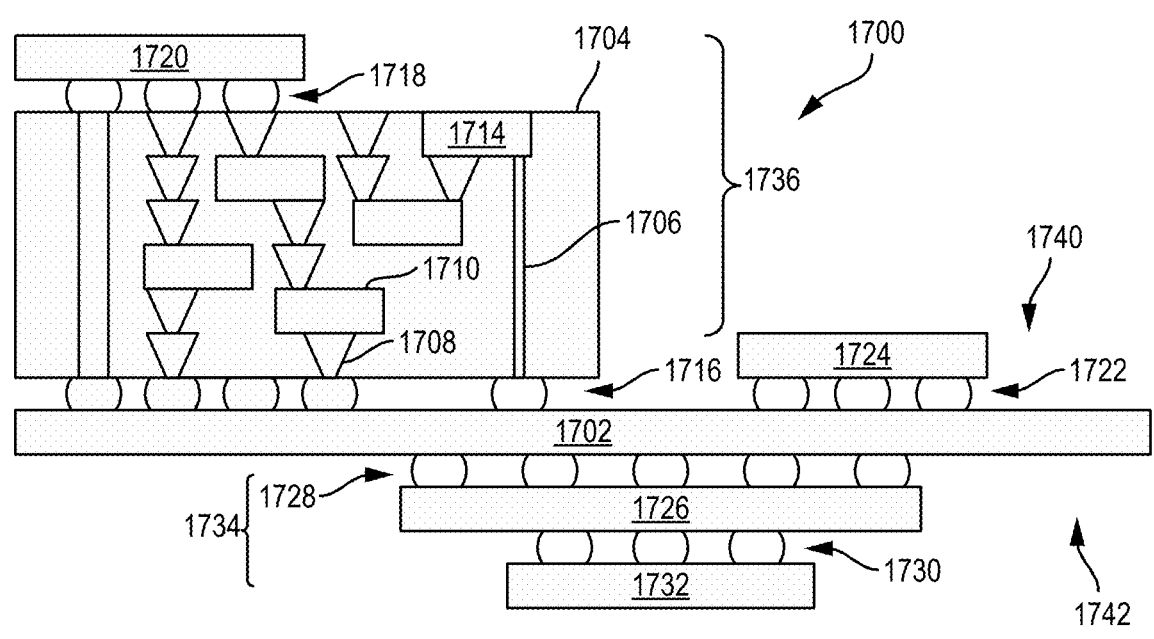
FIG. 10 is a cross-sectional side view of an IC device assembly that may include a microelectronic assembly, in accordance with any of the embodiments disclosed herein.

FIG. 10 is a cross-sectional side view of an IC device assembly 1700 that may include any of the microelectronic assemblies 100 disclosed herein. In some embodiments, the IC device assembly 1700 may be a microelectronic assembly 100. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, a circuit board.

The IC device assembly 1700 illustrated in FIG. 10 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 10, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 8), an IC device (e.g., the IC device 1600 of FIG. 9), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 10, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
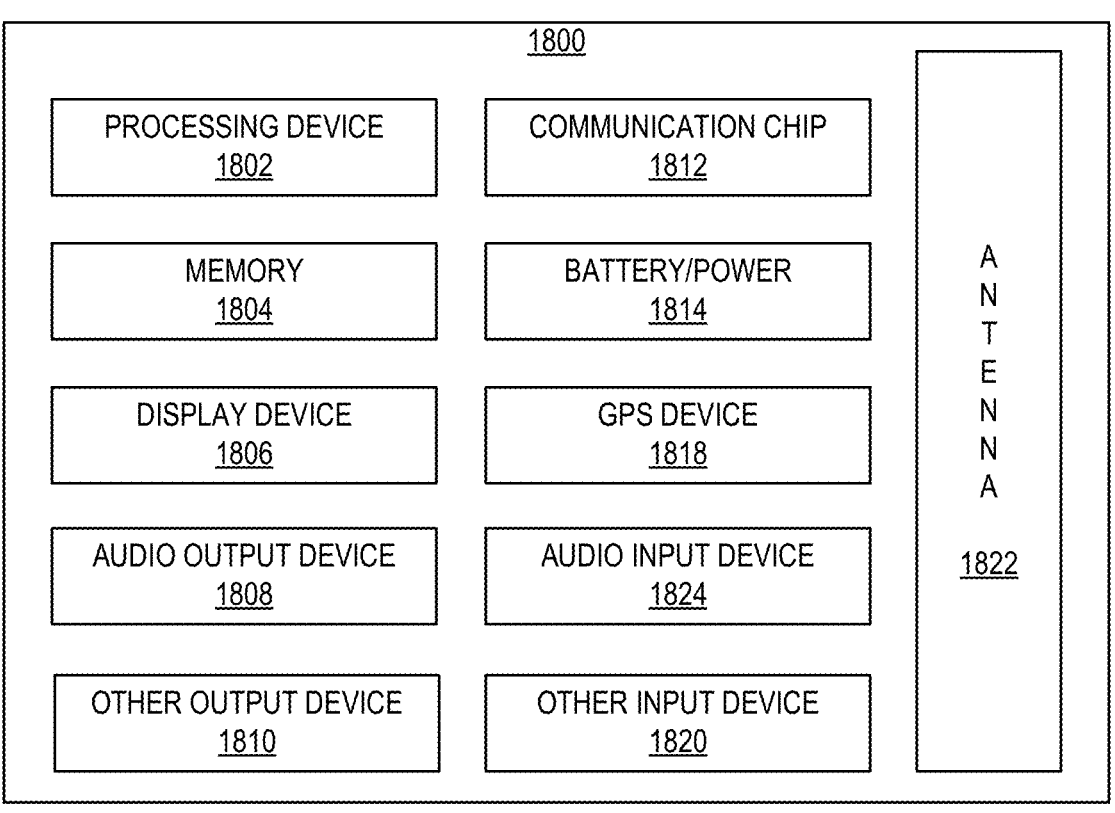
FIG. 11 is a block diagram of an example electrical device that may include a microelectronic assembly, in accordance with any of the embodiments disclosed herein.

FIG. 11 is a block diagram of an example electrical device 1800 that may include one or more of the microelectronic assemblies 100 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 100 disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic RAM (DRAM)), nonvolatile memory (e.g., readonly memory (ROM)), flash memory, solid state memory, and/or a hard drive. In some embodiments, the memory 1804 may include memory that shares a die with the processing device 1802. This memory may be used as cache memory and may include embedded dynamic RAM (eDRAM) or spin transfer torque magnetic RAM (STT-M RAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMLS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a computing device or a mobile computing device (e.g., a hand-held, portable or mobile electrical device, such as a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server, or other networked computing component, a printer, a scanner, a monitor, a set-top box, an entertainment control unit, a vehicle control unit, a digital camera, a digital video recorder, or a wearable computing device. In some embodiments, the electrical device 1800 may be any other electronic device that processes data.

The following examples pertain to further embodiments. The various features of the different embodiments may be variously combined with some features included and others excluded to suit a variety of different applications.

Example 1 is a microelectronic assembly, including a substrate having a surface including a first cavity; a die at least partially nested in the first cavity and electrically coupled to the substrate; and a circuit board having a surface including a second cavity, wherein the surface of the substrate is attached to the surface of the circuit board, and wherein the die extends, at least partially, into the second cavity in the circuit board.

Example 2 may include the subject matter of Example 1, and may further specify that the substrate is at least partially nested in the second cavity.

Example 3 may include the subject matter of Examples 1 or 2, and may further specify that the substrate is attached to the circuit board by an adhesive material.

Example 4 may include the subject matter of Examples 1 or 2, and may further specify that the substrate is attached to the circuit board by interconnects that electrically couple the substrate to the circuit board.

Example 5 may include the subject matter of any of Examples 1-4, and may further specify that the die is a first die, wherein the surface of the substrate is a first surface and the substrate further has an opposing second surface including a third cavity, and the microelectronic assembly may further include a second die at least partially nested in the third cavity and electrically coupled to the substrate.

Example 6 may include the subject matter of any of Examples 1-5, and may further specify that the die is electrically coupled to the circuit board.

Example 7 may include the subject matter of any of Examples 1-6, and may further specify that the second cavity has a terraced-contour.

Example 8 may include the subject matter of any of Examples 1-7, and may further include an underfill material between the surface of the substrate and the surface of the circuit board and around the die.

Example 9 may include the subject matter of any of Examples 1-8, and may further specify that the substrate is a package substrate.

Example 10 may include the subject matter of any of Examples 1-9, and may further specify that the circuit board is a printed circuit board.

Example 11 is microelectronic assembly, including a substrate having a first surface and an opposing second surface, the first surface of the substrate including a first cavity and the second surface of the substrate including a second cavity; a first die at least partially nested in the first cavity and electrically coupled to the first surface of the substrate; a second die at least partially nested in the second cavity and electrically coupled to the second surface of the substrate; and a circuit board having a surface, the surface including a third cavity, wherein the first surface of the substrate is attached to the surface of the circuit board, and wherein the first die extends, at least partially, into the third cavity of the circuit board.

Example 12 may include the subject matter of Example 11, and may further specify that the substrate is at least partially nested in the third cavity.

Example 13 may include the subject matter of Examples 11 or 12, and may further specify that the substrate is attached to the circuit board by an adhesive material.

Example 14 may include the subject matter of Examples 11 or 12, and may further specify that the substrate is attached to the circuit board by interconnects that electrically couple the substrate to the circuit board.

Example 15 may include the subject matter of any of Examples 11-14, and may further include a third die at least partially nested in the first cavity and electrically coupled to the substrate, wherein the third die extends, at least partially, into the third cavity in the circuit board.

Example 16 may include the subject matter of any of Examples 11-15, and may further specify that the first cavity has a first depth and the second cavity has a second depth different from the first depth.

Example 17 may include the subject matter of any of Examples 11-16, and may further specify that the first cavity has a first depth and the third cavity has a third depth different from the first depth.

Example 18 may include the subject matter of any of Examples 11-17, and may further specify that the first cavity has a terraced-contour.

Example 19 may include the subject matter of any of Examples 11-18, and may further specify that the third cavity has a terraced-contour.

Example 20 may include the subject matter of any of Examples 11-19, and may further include an underfill material between the first surface of the substrate and the surface of the circuit board.

Example 21 is a computing device, including a substrate having a first surface and an opposing second surface, the first surface of the substrate including a first cavity and the second surface of the substrate including a second cavity; a first die at least partially nested in the first cavity and electrically coupled to the first surface of the substrate; a second die at least partially nested in the second cavity and electrically coupled to the second surface of the substrate; and a circuit board having a surface, the surface including an opening having a terraced-contour forming a third cavity and a fourth cavity, wherein the first surface of the substrate is nested in the third cavity and attached to the surface of the circuit board, and wherein the first die extends at least partially into the fourth cavity of the circuit board.

Example 22 may include the subject matter of Example 21, and may further specify that the substrate is attached to a bottom surface of the third cavity in the circuit board by an adhesive material.

Example 23 may include the subject matter of Example 21, and may further specify that the substrate is attached to a bottom surface of the third cavity in the circuit board by interconnects that electrically couple the substrate to the circuit board.

Example 24 may include the subject matter of any of Examples 21-23, and may further specify that the first die or the second die is selected from the group consisting of a central processing unit, a platform controller hub, a memory die, a field programmable gate array silicon die, and graphic processing unit.

Example 25 may include the subject matter of any of Examples 21-23, and may further specify that the first die or the second die includes a memory device.

Example 26 may include the subject matter of any of Examples 21-23, and may further specify that the first die or the second die is a high bandwidth memory device.

Example 27 may include the subject matter of any of Examples 21-26, and may further specify that the computing device is included in a server device.

Example 28 may include the subject matter of any of Examples 21-26, and may further specify that the computing device is included in a portable computing device.

Example 29 may include the subject matter of any of Examples 21-26, and may further specify that the computing device is included in a wearable computing device.

Example 30 is a method of manufacturing a microelectronic assembly, including forming a first cavity in a surface of a substrate; at least partially nesting a die in the first cavity and electrically coupling the die to the substrate; forming a second cavity in a surface of a circuit board; and attaching the surface of the substrate to the surface of the circuit board with the die extending at least partially into the second cavity in the circuit board.

Example 31 may include the subject matter of Example 30, and may further specify that the substrate is attached to the circuit board by an adhesive material.

Example 32 may include the subject matter of Example 30, and may further specify that the substrate is attached to the circuit board by interconnects that electrically couple the substrate to the circuit board.

Example 33 may include the subject matter of any of Examples 30-32, and may further include electrically coupling the die to the circuit board.

Example 34 may include the subject matter of any of Examples 30-33, and may further specify that the die is a first die, wherein the surface of the substrate is a first surface and the substrate further has an opposing second surface, and the method may further include forming a third cavity in the second surface of the substrate; at least partially nesting a second die in the third cavity and electrically coupling the second die to the substrate.

Example 35 may include the subject matter of any of Examples 30-34, and may further specify that the first cavity has a terraced-contour.

Example 36 may include the subject matter of any of Examples 30-35, and may further specify that the second cavity has a terraced-contour.

The invention claimed is:

1. A microelectronic assembly, comprising:
a substrate having a surface including a first cavity;
a die at least partially nested in the first cavity and electrically coupled to the substrate; and
a circuit board having a surface including a second cavity, wherein the surface of the substrate is attached to the surface of the circuit board, and wherein the die extends, at least partially, into the second cavity in the circuit board, wherein the die is electrically coupled to the circuit board.

2. The microelectronic assembly of claim 1, wherein the substrate is at least partially nested in the second cavity.

3. The microelectronic assembly of claim 1, wherein the substrate is attached to the circuit board by an adhesive material.

4. The microelectronic assembly of claim 1, wherein the substrate is attached to the circuit board by interconnects that electrically couple the substrate to the circuit board.

5. The microelectronic assembly of claim 1, wherein the die is a first die, wherein the surface of the substrate is a first surface and the substrate further has an opposing second surface including a third cavity, and the microelectronic assembly, further comprising:
a second die at least partially nested in the third cavity and electrically coupled to the substrate.

6. A microelectronic assembly, comprising:
a substrate having a surface including a first cavity;
a die at least partially nested in the first cavity and electrically coupled to the substrate; and
a circuit board having a surface including a second cavity, wherein the surface of the substrate is attached to the surface of the circuit board, and wherein the die extends, at least partially, into the second cavity in the circuit board, wherein the second cavity has a terraced-contour.

7. The microelectronic assembly of claim 1, further comprising:
an underfill material between the surface of the substrate and the surface of the circuit board and around the die.

8. The microelectronic assembly of claim 1, wherein the substrate is a package substrate.

9. The microelectronic assembly of claim 1, wherein the circuit board is a printed circuit board.

10. A microelectronic assembly, comprising:
an integrated circuit (IC) package, including:
a substrate having a first surface and an opposing second surface, the first surface of the substrate including a first cavity and the second surface of the substrate including a second cavity;
a first die at least partially nested in the first cavity and electrically coupled to the first surface of the substrate; and
a second die at least partially nested in the second cavity and electrically coupled to the second surface of the substrate; and
a circuit board having a surface, the surface including a third cavity, wherein the first surface of the substrate is attached to the surface of the circuit board, and wherein the first die extends, at least partially, into the third cavity of the circuit board, and wherein the die is electrically coupled to the circuit board.

11. The microelectronic assembly of claim 10, wherein the substrate is at least partially nested in the third cavity.

12. The microelectronic assembly of claim 10, further comprising:
a third die at least partially nested in the first cavity and electrically coupled to the substrate, wherein the third die extends, at least partially, into the third cavity in the circuit board.

13. A microelectronic assembly, comprising:
an integrated circuit (IC) package, including:
a substrate having a first surface and an opposing second surface, the first surface of the substrate including a first cavity and the second surface of the substrate including a second cavity;
a first die at least partially nested in the first cavity and electrically coupled to the first surface of the substrate;
a second die at least partially nested in the second cavity and electrically coupled to the second surface of the substrate; and
a circuit board having a surface, the surface including a third cavity, wherein the first surface of the substrate is attached to the surface of the circuit board, and wherein the first die extends, at least partially, into the third cavity of the circuit board, wherein the first cavity has a first depth and the second cavity has a second depth different from the first depth.

14. A microelectronic assembly, comprising:
an integrated circuit (IC) package, including:
a substrate having a first surface and an opposing second surface, the first surface of the substrate including a first cavity and the second surface of the substrate including a second cavity;
a first die at least partially nested in the first cavity and electrically coupled to the first surface of the substrate;
a second die at least partially nested in the second cavity and electrically coupled to the second surface of the substrate; and
a circuit board having a surface, the surface including a third cavity, wherein the first surface of the substrate is attached to the surface of the circuit board, and wherein the first die extends, at least partially, into the third cavity of the circuit board, wherein the first cavity or the third cavity has a terraced-contour.

* * * * *